(12) United States Patent
Muller et al.

(10) Patent No.: US 8,524,051 B2
(45) Date of Patent: *Sep. 3, 2013

(54) COATED ARTICLE WITH OXIDATION GRADED LAYER PROXIMATE IR REFLECTING LAYER(S) AND CORRESPONDING METHOD

(75) Inventors: Jens-Peter Muller, Differdange (LU); Vijayen S Veerasamy, Ann Arbor, MI (US)

(73) Assignees: Centre Luxembourg de Recherches pour le Verre et al Ceramique S. A. (C.R.V.C.), Grand Duche de Luxembourg; Guardian Industries Corp., Auburn Hills, MI (US)

( * ) Notice: Subject to any disclaimer, the term of this patent is extended or adjusted under 35 U.S.C. 154(b) by 1994 days.

This patent is subject to a terminal disclaimer.

(21) Appl. No.: 10/847,672

(22) Filed: May 18, 2004

(65) Prior Publication Data

US 2005/0258029 A1 Nov. 24, 2005

(51) Int. Cl.
*C23C 14/00* (2006.01)
*C23C 14/32* (2006.01)
*H05H 1/00* (2006.01)

(52) U.S. Cl.
USPC ............ 204/192.27; 204/192.11; 204/192.15; 204/192.26; 204/192.28; 204/192.29; 427/533; 427/539

(58) Field of Classification Search
USPC .......... 117/108; 204/192.11, 192.26, 192.27, 204/192.15, 192.29; 359/586; 428/212, 428/216, 428, 432; 427/533, 539
See application file for complete search history.

(56) References Cited

U.S. PATENT DOCUMENTS

| | | | |
|---|---|---|---|
| 4,919,778 A * | 4/1990 | Dietrich et al. .......... 204/192.27 |
| 5,425,861 A | 6/1995 | Hartig et al. |
| 5,443,862 A | 8/1995 | Buffat et al. |
| 5,514,476 A | 5/1996 | Hartig et al. |
| 5,569,362 A | 10/1996 | Lerbet et al. |
| 5,595,825 A * | 1/1997 | Guiselin ................. 428/428 |
| 5,709,930 A * | 1/1998 | DePauw ................. 428/216 |
| 5,965,246 A * | 10/1999 | Guiselin et al. .......... 428/212 |
| 6,261,693 B1 | 7/2001 | Veerasamy |
| 6,359,388 B1 | 3/2002 | Petrmichl |
| 6,395,333 B2 | 5/2002 | Veerasamy |
| 6,447,891 B1 | 9/2002 | Veerasamy et al. |
| 6,461,731 B1 | 10/2002 | Veerasamy et al. |
| 6,576,349 B2 | 6/2003 | Lingle et al. |
| 6,592,992 B2 | 7/2003 | Veerasamy |
| 6,660,340 B1 | 12/2003 | Kirkpatrick |
| 6,665,033 B2 | 12/2003 | Callegari et al. |
| 6,689,476 B2 | 2/2004 | Veerasamy et al. |

(Continued)

FOREIGN PATENT DOCUMENTS

| | | |
|---|---|---|
| JP | 02088761 A * | 3/1990 |
| JP | 10-194755 | 7/1998 |
| WO | WO 0138246 A2 * | 5/2001 |

*Primary Examiner* — Michael Band
(74) *Attorney, Agent, or Firm* — Nixon & Vanderhye P.C.

(57) ABSTRACT

A coated article is provided that may be heat treated in certain example embodiments. A graded layer (e.g., contact layer or other suitable layer) is formed by initially sputter-depositing a layer, and thereafter ion beam treating the sputter-deposited layer with at least reactive gas ions in order to form a graded layer. In certain example embodiments, the result is a coated article that has improved visible transmission and/or durability, without sacrificing optional heat treatability.

45 Claims, 7 Drawing Sheets

(56) References Cited

U.S. PATENT DOCUMENTS

| | | |
|---|---|---|
| 6,706,363 B2 | 3/2004 | Honda et al. |
| 6,713,178 B2 | 3/2004 | Veerasamy |
| 6,723,211 B2 | 4/2004 | Lingle et al. |
| 6,844,976 B1 * | 1/2005 | Firon et al. .................... 359/586 |
| 7,229,533 B2 * | 6/2007 | Veerasamy .............. 204/192.27 |
| 7,311,975 B2 * | 12/2007 | Butz et al. ..................... 428/432 |
| 2002/0064662 A1 | 5/2002 | Lingle et al. |
| 2003/0064198 A1 | 4/2003 | Thomsen et al. |
| 2003/0104221 A1 | 6/2003 | Stachowiak |
| 2003/0150711 A1 | 8/2003 | Laird |
| 2003/0194567 A1 | 10/2003 | Lingle et al. |
| 2003/0194570 A1 | 10/2003 | Lingle et al. |
| 2003/0194616 A1 | 10/2003 | Carcia et al. |
| 2003/0198816 A1 | 10/2003 | Lingle et al. |
| 2004/0067362 A1 | 4/2004 | Veerasamy et al. |
| 2004/0067363 A1 | 4/2004 | Bienkiewicz et al. |

* cited by examiner

COATED ARTICLE WITH OXIDATION GRADED LAYER PROXIMATE IR REFLECTING LAYER(S) AND CORRESPONDING METHOD

This invention relates to a coated article including a low-E coating, which includes, for example, a graded layer (e.g., oxidation graded layer). In certain example embodiments, the graded layer is graded in a manner such that it becomes less oxidized closer to an infrared (IR) reflecting layer. In certain example embodiments, a sputtered layer comprising at least one metal may be ion beam treated in order to introduce oxygen into the layer thereby forming the oxidation graded layer. Coated articles according to certain example embodiments of this invention may be used in the context of vehicle windshields, insulating glass (IG) window units, other types of windows, or in any other suitable application.

BACKGROUND OF THE INVENTION

Coated articles are known in the art for use in window application such as insulating glass (IG) window units, vehicle windows, and/or the like. It is known that in certain instances, it is sometimes desirable to heat treat (e.g., thermally temper, heat bend and/or heat strengthen) such coated articles for purposes of tempering, bending, or the like in certain example instances. Example non-limiting low-emissivity (low-E) coatings are illustrated and/or described in U.S. Pat. Nos. 6,723,211; 6,576,349; 6,447,891; 6,461,731; 3,682, 528; 5,514,476; 5,425,861; and 2003/0150711, the disclosures of which are all hereby incorporated herein by reference.

In certain situations, designers of coated articles with low-E coatings often strive for a combination of high visible transmission, substantially neutral color, low emissivity (or emittance), and low sheet resistance ($R_s$). High visible transmission for example may permit coated articles to be more desirable in applications such as vehicle windshields or the like, whereas low-emissivity (low-E) and low sheet resistance characteristics permit such coated articles to block significant amounts of IR radiation so as to reduce for example undesirable heating of vehicle or building interiors.

The use of oxidation graded layer(s) in low-E coatings is known. For example, see commonly owned U.S. Pat. Nos. 6,576,349 and 6,723,211, the entire disclosures of which are hereby incorporated herein by reference. The '349 patent, for example, explains that a contact layer(s) is oxidation graded so as to become less oxidized closer to an IR reflecting layer of a material such as silver. The '349 patent explains, for example, that oxidation grading of contact layer(s) is advantageous in that it permits high visible transmission to be achieved in combination with optional heat treatability.

However, the oxidation grading of a $NiCrO_x$ contact layer(s) is typically formed by sputtering. For example, more oxygen gas may be introduced via one side of a NiCr sputtering target compared to another side of the target, thereby resulting in oxidation grading of the $NiCrO_x$ layer being sputter-deposited. While this typically works very well, there are certain drawbacks. First, while sputtering a NiCr target in an oxygen inclusive atmosphere tends to cause significant amounts of chromium oxide to form in the resulting layer, the nickel does not so easily become nickel oxide (i.e., much Ni may remain in metallic form in the resulting layer). This can sometimes be undesirable in that metallic Ni tends to reduce visible transmission of the resulted coated article. Second, the use of large amounts of oxygen in a sputtering zone of a sputter coater sometimes causes undesirable target flaking to occur.

In view of the above, it will be apparent to those skilled in the art that there exists a need for a technique for forming an oxidation graded layer in a coating in a more efficient manner. In certain example instances, there exists a need for a technique for forming an oxidation graded layer in a coating in a manner which results in: (a) more oxidation of Ni if a NiCr target or the like is used in sputtering; (b) less oxygen being required in a given zone(s) or bay(s) of a sputter coater; and/or (c) reduction or elimination of the flaking effect problem.

BRIEF SUMMARY OF EXAMPLE EMBODIMENTS OF THE INVENTION

In certain example embodiments of this invention, ion beam treatment is used to control and/or modify stoichiometry of a layer(s) in a coating (i.e., stoichiometry modification and/or control). The layer(s) to be modified may be deposited on a substrate such as a glass substrate, and other layer(s) may or may not be located between the glass substrate and the layer(s) to be modified by ion treatment. In certain example embodiments, the ion treatment may utilize at least oxygen ions. When oxygen ions are used to ion beam treat an originally deposited metal layer or slightly oxided layer, an oxidation graded layer may result.

In certain example embodiments of this invention, an oxidation graded layer in a solar control coating may be formed in the following manner. First, a layer is sputter-deposited on a substrate (either directly on the substrate, or alternatively on the substrate over other layer(s)). Then, the sputter-deposited layer is subjected to an ion beam treatment, wherein the ion beam includes at least oxygen ions. The oxygen inclusive ion beam treatment introduces oxygen ions into the sputter-deposited layer. The ion beam is directed at the layer in a manner so as to create an oxidation graded effect in the layer such that the layer following the ion beam treatment is more metallic closer to an infrared (IR) reflecting layer than at a location further from the IR reflecting layer. The oxidation graded layer has improved (higher) visible transmission, and due to its more metallic nature closer to the IR reflecting layer is able to better protect the IR reflecting layer during potential heat treatment such as thermal tempering or heat strengthening.

In certain example embodiments of this invention, there is provided a method of making a coated article, the method comprising: providing a glass substrate; sputtering a layer comprising silver on the glass substrate; sputtering a layer comprising NiCr on the substrate over the layer comprising silver, so that the layer comprising NiCr contacts the layer comprising silver; ion beam treating at least an upper surface of the layer comprising NiCr with at least oxygen ions so that following said ion beam treating the layer comprising NiCr is more oxidized at a location further from the layer comprising silver than at a location closer to the layer comprising silver; and following said ion beam treating, sputtering at least a dielectric layer over the layer comprising NiCr.

In other example embodiments of this invention, there is provided a method of making a coated article, the method comprising: providing a glass substrate; sputtering an IR reflecting layer on the glass substrate; sputtering a layer comprising Ni and/or Cr on the glass substrate over the IR reflecting layer; and ion beam treating at least an upper surface of the layer comprising Ni and/or Cr with at least oxygen so that following said ion beam treating the layer comprising Ni and/or Cr is more oxidized at a location further from the IR reflecting layer than at a location closer to the IR reflecting layer.

In still other example embodiments of this invention, there is provided a method of making a coated article, the method comprising: providing a substrate; forming a layer comprising at least one metal on the substrate; ion beam treating at least an upper surface of the layer comprising the at least one metal so that following said ion beam treating the layer is more oxidized at a location further from the substrate than at a location closer to the substrate.

In other example embodiments of this invention, there is provided a method of making a coated article, the method comprising: providing a glass substrate; sputtering a layer on the glass substrate; ion beam treating at least an upper surface of the layer on the glass substrate with at least one reactive gas so as to modify a stoichiometry thereof; and following said ion beam treating sputtering at least another layer over the layer that has been ion beam treated.

DETAILED DESCRIPTION OF EXAMPLES OF THE INVENTION

Figure 1:
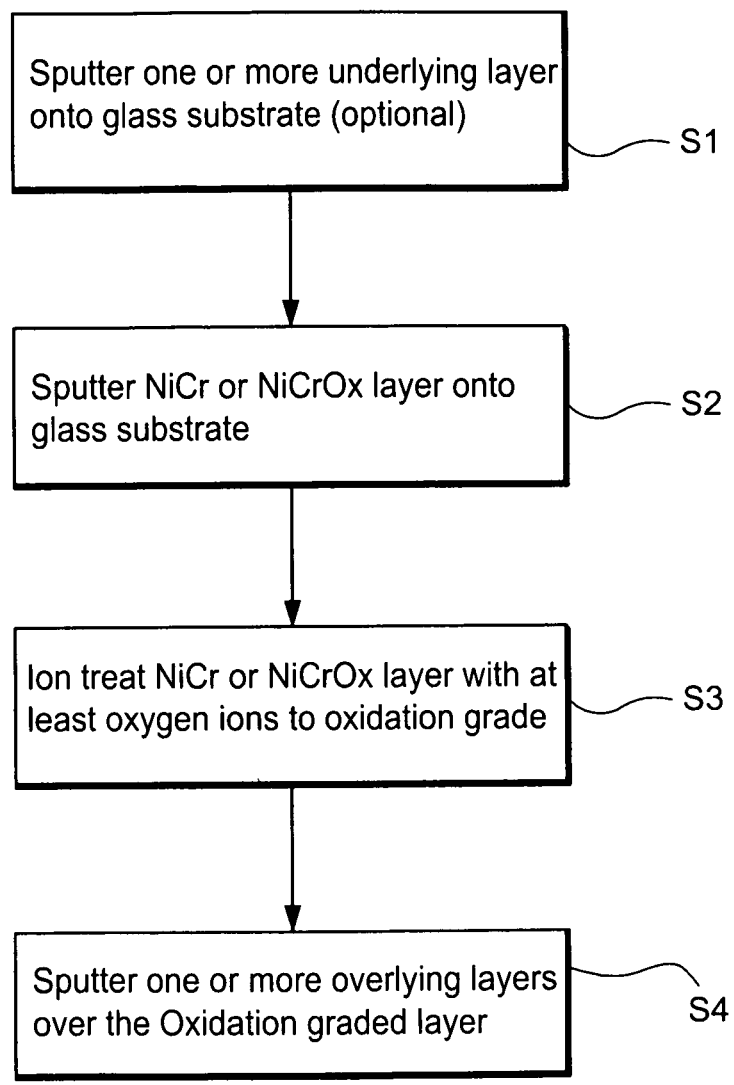
FIG. 1 is a flowchart illustrating certain steps carried out in making a coated article according to an example embodiment of this invention.

Coated articles herein may be used in applications such as vehicle windshields, monolithic windows, IG window units, and/or any other suitable application that includes single or multiple glass substrates. In vehicle windshield applications, for example, a pair of glass substrates may be laminated together with a polymer based layer of a material such as PVB, and the coating is provided on the interior surface of one of the glass substrates adjacent the polymer based layer. In certain example embodiments of this invention, the coating includes a double-silver stack, although this invention is not so limited in all instances (e.g., single silver stacks may also be used in accordance with certain embodiments of this invention).

In certain example embodiments of this invention, ion beam treatment is used to control and/or modify stoichiometry of a layer(s) in a coating (i.e., stoichiometry modification and/or control). The layer(s) to be modified may be deposited on a substrate such as a glass substrate, and other layer(s) may or may not be located between the glass substrate and the layer(s) to be modified by ion beam treatment. In certain example embodiments, the ion beam treatment may utilize at least oxygen ions. When oxygen ions are used to ion beam treat an originally deposited metal layer or slightly oxided layer, an oxidation graded layer may result.

In certain example embodiments of this invention, an oxidation graded layer in a solar control coating may be formed in the following manner. First, a layer is sputter-deposited on a substrate (either directly on the substrate, or alternatively on the substrate over other layer(s)). This layer in certain example embodiments may be originally sputter-deposited as including or of NiCr of $NiCrO_x$, although this invention is not so limited. Then, the sputter-deposited layer is subjected to an ion beam treatment, wherein the ion beam includes at least oxygen ions in certain example embodiments. The ion beam may be a focused ion beam, a collimated ion beam, or a diffused ion beam in different embodiments of this invention. The oxygen inclusive ion beam treatment introduces oxygen ions into the sputter-deposited layer, thereby creating an oxidation graded effect in the layer such that the layer following the ion beam treatment is more metallic closer to an infrared (IR) reflecting layer than at a location further from the IR reflecting layer. The portion of the layer closest to the IR reflecting layer may be entirely metallic in certain example instances or alternatively may be relatively less oxided compared to other parts of the layer in other example embodiments of this invention.

The oxidation graded layer has improved (higher) visible transmission (compared to a purely metallic layer), and due to its more metallic nature closer to the IR reflecting layer is able to better protect the IR reflecting layer during optional heat treatment such as thermal tempering, heat bending, and/or heat strengthening. Moreover, it has surprisingly been found that ion beam plasma (including at least oxygen) is able to oxidize a higher amount of Ni atoms compared to merely sputtering in an oxygen inclusive atmosphere. In particular, merely sputtering NiCr target(s) in an oxygen inclusive atmosphere tends to oxide Cr atoms more than Ni atoms. The use of the ion beam treatment herein tends to permit more Ni to be oxided in the end layer. Again, this helps to improve transmission characteristics of the coating, without sacrificing heat treatability in certain example embodiments of this invention. Moreover, another unexpected advantage of certain embodiments of this invention is that it has unexpectedly been found that a more metallic part of the oxidation graded layer sticks better to the IR reflecting layer (e.g., Ag layer), whereas a more oxidized part sticks better to the overlying dielectric layer(s). Thus, ion beam plasma irradiation herein improves adhesion and thus durability of the coated article as an additional advantage. Yet another advantage associated with certain embodiments of this invention is that growing $NiCrO_x$ from metallic NiCr target(s) in oxygen inclusive atmosphere can result in more particulates than originally sputtering NiCr in a substantially inert atmosphere to provide a substantially metallic layer of NiCr and then ion beam treating the substantially metallic layer in order to oxide the same.

This type of oxidation grading of a layer may be performed on one or more layers of a given coating in different embodiments of this invention.

Coated articles according to different embodiments of this invention may or may not be heat treated (HT) in different instances. The terms "heat treatment" and "heat treating" as used herein mean heating the article to a temperature sufficient to achieve thermal tempering, heat bending, and/or heat strengthening of the glass inclusive article. This definition includes, for example, heating a coated article in an oven or furnace at a temperature of least about 580 degrees C., more preferably at least about 600 degrees C., for a sufficient period to allow tempering, bending, and/or heat strengthening. In certain instances, the HT may be for at least about 4 or 5 minutes.

FIG. 1 is a flowchart illustrating certain steps carried out according to an example embodiment of this invention. Initially, a glass substrate is provided. One or more underlying layers is/are then deposited (e.g., sputter deposited) onto the glass substrate (S1). For example, in embodiments where a plurality of underlayers are provided, a first dielectric layer may be deposited on the substrate and thereafter an IR reflecting layer of a material such as Ag, Au or the like may be deposited on the substrate over at least the first dielectric layer. Then, a layer such as a contact layer of or including NiCr is sputter-deposited on the glass substrate over the underlying layer(s) (S2). While this sputter-deposited layer is ultimately to be transformed into a type of oxidation graded layer, it is typically originally sputter-deposited in a manner where it is not significantly oxidation graded (although it may be oxidation graded to some extent as originally sputter-deposited in other example embodiments). This layer may be originally sputter deposited as a layer of or including NiCr, Ni, $NiCrO_x$ or any other suitable material.

Still referring to FIG. 1, after step S2 has been completed, the layer sputter-deposited in step S2 is then treated with an ion beam including at least oxygen ions (S3). This ion beam treatment introduces at least oxygen ions into the layer deposited in step S2. An ion energy of the ion source is utilized which will cause the vast majority of oxygen ions to make their way only part-way through the layer originally sputter-deposited in step S2. Since the vast majority of oxygen ions make their way through only part of the layer, the layer becomes oxidation graded since the part of the layer farthest from the ion source is much less oxided (if at all) than those portions closer to the ion source. After the layer has been ion beam treated and thus oxidation graded, addition overlying layer(s) are then sputter-deposited over the oxidation graded layer (S4). For example, one or more dielectric layers may be sputter-deposited over the graded layer in step S4 in certain example embodiments of this invention.

Figure 2:
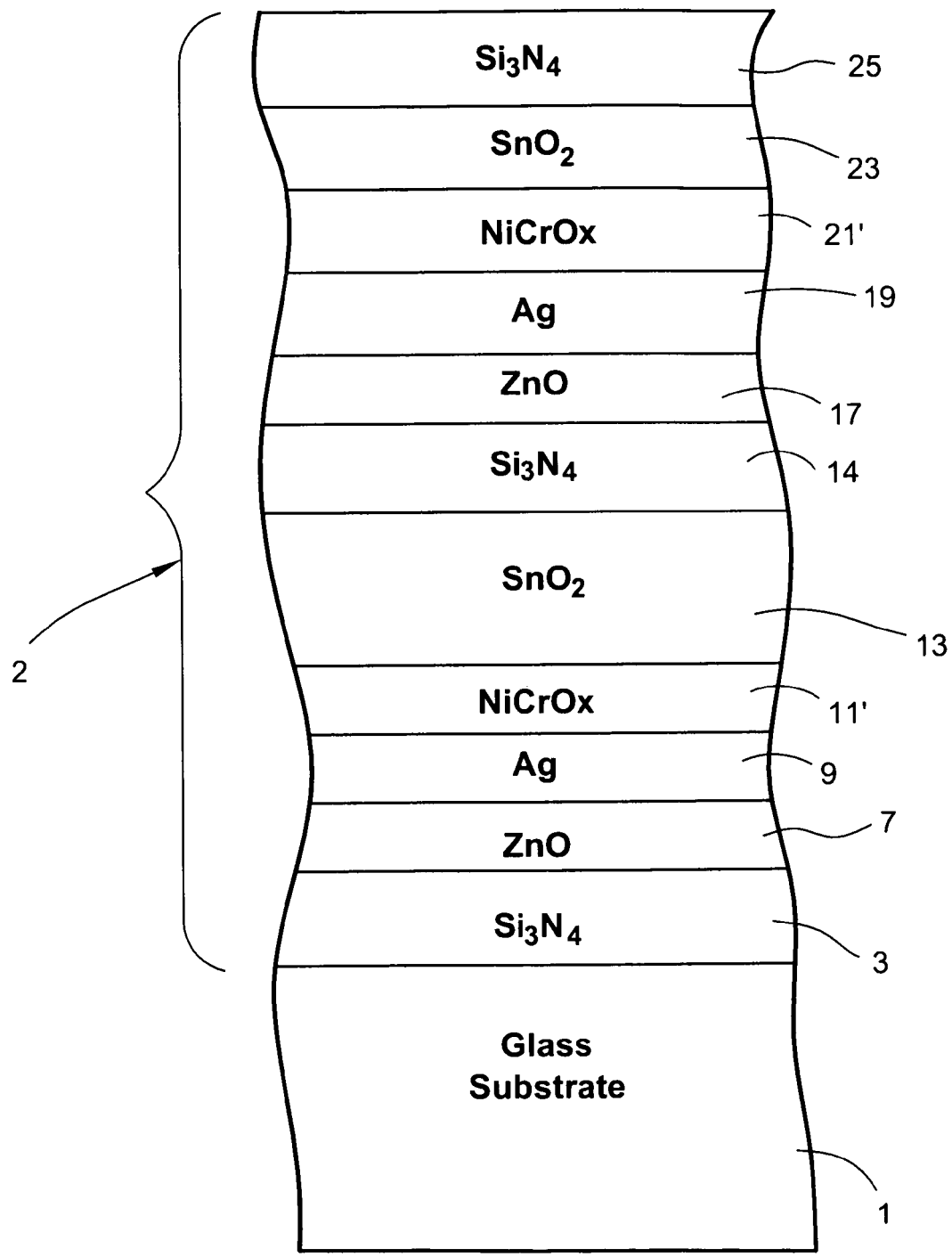
FIG. 2 is a cross sectional view of a coated article according to an example embodiment of this invention.

FIG. 2 is a side cross sectional view of a coated article according to an example non-limiting embodiment of this invention. The coated article includes substrate 1 (e.g., clear, green, bronze, or blue-green glass substrate from about 1.0 to 10.0 mm thick, more preferably from about 1.0 mm to 3.5 mm thick), and a low-E coating (or layer system) 2 provided on the substrate 1 either directly or indirectly. The coating (or layer system) 2 includes, in this example embodiment: dielectric silicon nitride layer 3 which may be of $Si_3N_4$, of the Si-rich type for haze reduction, or of any other suitable stoichiometry of silicon nitride in different embodiments of this invention, first lower contact layer 7 (which contacts IR reflecting layer 9), first conductive and preferably metallic or substantially metallic infrared (IR) reflecting layer 9, first upper contact layer 11' (which contacts layer 9), dielectric layer 13 (which may be deposited in one or multiple steps in different embodiments of this invention), another silicon nitride layer 14, second lower contact layer 17 (which contacts IR reflecting layer 19), second conductive and preferably metallic IR reflecting layer 19, second upper contact layer 21' (which contacts layer 19), dielectric layer 23, and finally protective dielectric layer 25. The "contact" layers 7, 11, 17 and 21 each contact at least one IR reflecting layer (e.g., layer based on Ag). The aforesaid layers 3-25 make up low-E (i.e., low emissivity) coating 2 which is provided on glass or plastic substrate 1.

In monolithic instances, the coated article includes only one glass substrate 1 as illustrated in FIG. 2. However, monolithic coated articles herein may be used in devices such as laminated vehicle windshields, IG window units, and the like. A laminated vehicle window such as a windshield includes first and second glass substrates laminated to one another via a polymer based interlayer (e.g., see U.S. Pat. No. 6,686,050, the disclosure of which is incorporated herein by reference). One of these substrates of the laminate may support coating 2 on an interior surface thereof in certain example embodiments. As for IG window units, an IG window unit may include two spaced apart substrates 1. An example IG window unit is illustrated and described, for example, in U.S. Pat. No. 6,632,491, the disclosure of which is hereby incorporated herein by reference. An example IG window unit may include, for example, the coated glass substrate 1 shown in FIG. 2 coupled to another glass substrate via spacer(s), sealant(s) or the like with a gap being defined therebetween. This gap between the substrates in IG unit embodiments may in certain instances be filled with a gas such as argon (Ar). An example IG unit may comprise a pair of spaced apart clear glass substrates each about 4 mm thick one of which is coated with a coating herein in certain example instances, where the gap between the substrates may be from about 5 to 30 mm, more preferably from about 10 to 20 mm, and most preferably about 16 mm. In certain example instances, the coating 2 may be provided on the interior surface of either substrate facing the gap.

In certain example embodiments of this invention, one or both of upper contact layer(s) 11' and/or 21' is oxidation graded. Thus, at least one of NiCr inclusive contact layers 11' and/or 21' has been ion beam treated with at least oxygen ions in order to oxidation graded the same in certain example embodiments of this invention.

Example details relating to layers 3, 7, 9, 13, 14, 17, 19, 23 and 25 of the FIG. 2 coating are discussed in U.S. patent application Ser. No. 10/800,012, the disclosure of which is hereby incorporated herein by reference. For example, dielectric layers 3 and 14 may be of or include silicon nitride in certain embodiments of this invention. Silicon nitride layers 3 and 14 may, among other things, improve heat-treatability of the coated articles, e.g., such as thermal tempering or the like. The silicon nitride of layers 3 and/or 14 may be of the stoichiometric type ($Si_3N_4$) type, or alternatively of the Si-rich type in different embodiments of this invention. Any and/or all of the silicon nitride layers discussed herein may be doped with other materials such as stainless steel or aluminum in certain example embodiments of this invention. For example, any and/or all silicon nitride layers discussed herein may optionally include from about 0-15% aluminum, more preferably from about 1 to 10% aluminum, most preferably from 1-4% aluminum, in certain example embodiments of this invention. The silicon nitride may be deposited by sputtering a target of Si or SiAl in certain embodiments of this invention.

Infrared (IR) reflecting layers 9 and 19 are preferably substantially or entirely metallic and/or conductive, and may comprise or consist essentially of silver (Ag), gold, or any other suitable IR reflecting material. IR reflecting layers 9 and 19 help allow the coating to have low-E and/or good solar control characteristics. The IR reflecting layers may, however, be slightly oxidized in certain embodiments of this invention. Dielectric layer 13 may be of or include tin oxide in certain example embodiments of this invention. However, as with other layers herein, other materials may be used in different instances. Lower contact layers 7 and/or 17 in certain embodiments of this invention are of or include zinc oxide (e.g., ZnO). The zinc oxide of layer(s) 7, 17 may contain other materials as well such as Al (e.g., to form $ZnAlO_x$). For example, in certain example embodiments of this invention, one or more of zinc oxide layers 7, 17 may be doped with from about 1 to 10% Al, more preferably from about 1 to 5% Al, and most preferably about 2 to 4% Al. The use of zinc oxide 7, 17 under the silver 9, 19 allows for an excellent quality of silver to be achieved.

Dielectric layer 23 may be of or include tin oxide in certain example embodiments of this invention. However, layer 23 is optional and need not be provided in certain example embodiments of this invention. Dielectric layer 25, which may be an overcoat including one or more layers in certain example instances, may be of or include silicon nitride (e.g., $Si_3N_4$) or any other suitable material in certain example embodiments of this invention. Optionally, other layers may be provided above layer 25. Optionally, a silicon nitride inclusive layer 25 may be located directly on an over oxidation graded layer 21'. Layer 25 is provided for durability purposes, and to protect the underlying layers during heat treatment and/or environmental use. In certain example embodiments, layer 25 may have an index of refraction (n) of from about 1.9 to 2.2, more preferably from about 1.95 to 2.05.

Other layer(s) below or above the illustrated coating may also be provided. Thus, while the layer system or coating is "on" or "supported by" substrate 1 (directly or indirectly), other layer(s) may be provided therebetween. Thus, for example, the coating of FIG. 2 may be considered "on" and "supported by" the substrate 1 even if other layer(s) are provided between layer 3 and substrate 1. Moreover, certain layers of the illustrated coating may be removed in certain embodiments, while others may be added between the various layers or the various layer(s) may be split with other layer(s) added between the split sections in other embodiments of this invention without departing from the overall spirit of certain embodiments of this invention.

While various thicknesses and materials may be used in layers in different embodiments of this invention, example thicknesses and materials for the respective layers on the glass substrate 1 in the FIG. 2 embodiment are as follows, from the glass substrate 1 outwardly:

Example Materials/Thicknesses; FIG. 2 Embodiment

| Layer<br>Glass (1-10 mm thick) | Preferred<br>Range (Å) | More<br>Preferred (Å) | Example (Å) |
|---|---|---|---|
| $Si_xN_y$ (layer 3) | 40-450 Å | 190-250 Å | 210 |
| $ZnO_x$ (layer 7) | 10-300 Å | 40-150 Å | 100 |
| Ag (layer 9) | 50-250 Å | 80-120 Å | 98 |
| $NiCrO_x$ (layer 11') (graded) | 10-100 Å | 30-45 Å | 35 |
| $SnO_2$ (layer 13) | 0-1,000 Å | 350-630 Å | 570 |
| $Si_xN_y$ (layer 14) | 50-450 Å | 90-150 Å | 120 |
| $ZnO_x$ (layer 17) | 10-300 Å | 40-150 Å | 95 |

-continued

| Layer<br>Glass (1-10 mm thick) | Preferred<br>Range (Å) | More<br>Preferred (Å) | Example (Å) |
|---|---|---|---|
| Ag (layer 19) | 50-250 Å | 80-220 Å | 96 |
| $NiCrO_x$ (layer 21') (graded) | 10-100 Å | 30-45 Å | 35 |
| $SnO_2$ (layer 23) | 0-750 Å | 150-300 Å | 200 |
| $Si_3N_4$ (layer 25) | 0-750 Å | 100-320 Å | 180 |

At least one of layers 11' and 21' is oxidation graded in certain example embodiments of this invention, by way of ion beam treatment thereof after original deposition of the layer by sputter-deposition. Thus, at least one of layers 11' and 21' is more oxidized at a location further from the adjacent IR reflecting layer than at another location closer to the adjacent IR reflecting layer. Stated another way, at least one of layers 11' and 21' is more metallic at a location closer to the adjacent IR reflecting layer than at another location further from the adjacent IR reflecting layer. By oxidation grading at least one of contact layers 11' and 21', the oxidation graded layer(s) has improved (higher) visible transmission (compared to non-oxided purely metallic layers), and due to its more metallic nature closer to the IR reflecting layer, is able to better protect the adjacent IR reflecting layer during optional heat treatment such as thermal tempering, heat bending, and/or heat strengthening. In certain example instances, it is also possible to provide another layer (e.g., metal layer, or the like) between the oxidation graded layer (11', 21') and the adjacent IR reflecting layer (9, 19).

Figure 3:
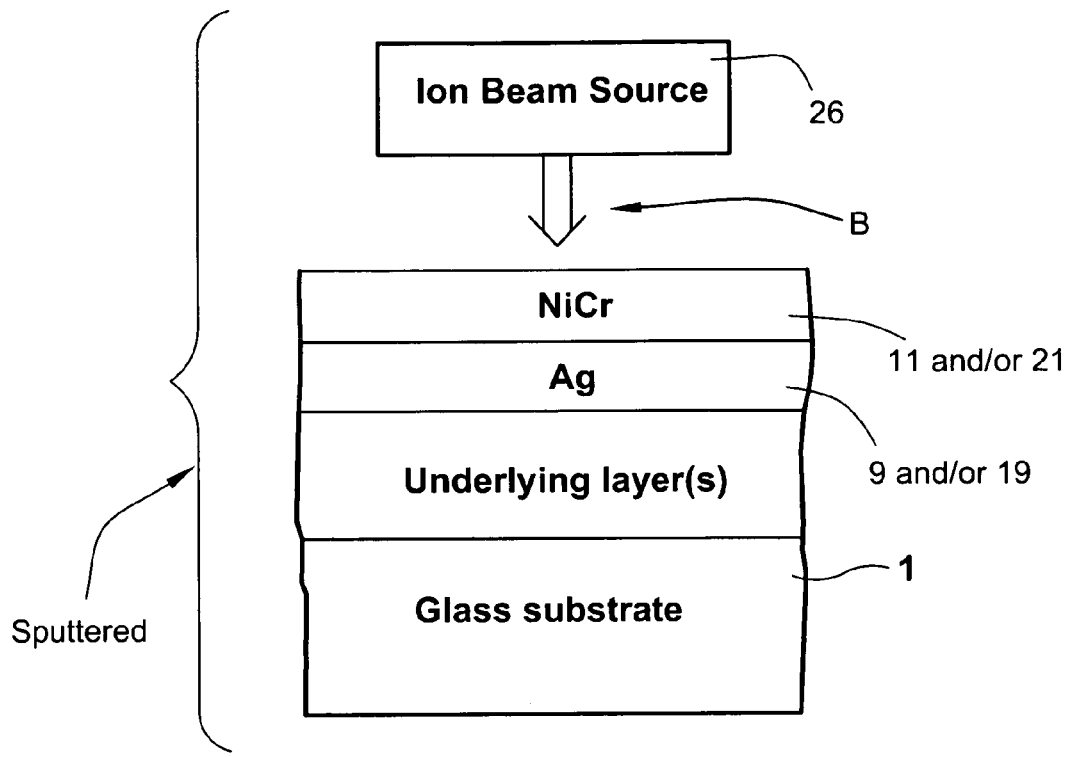
FIG. 3 is a cross sectional view of a coated article according to an example embodiment of this invention, in a mid-production step, being ion beam treated with at least oxygen ions in order to form an oxidation graded layer.
Figure 4:
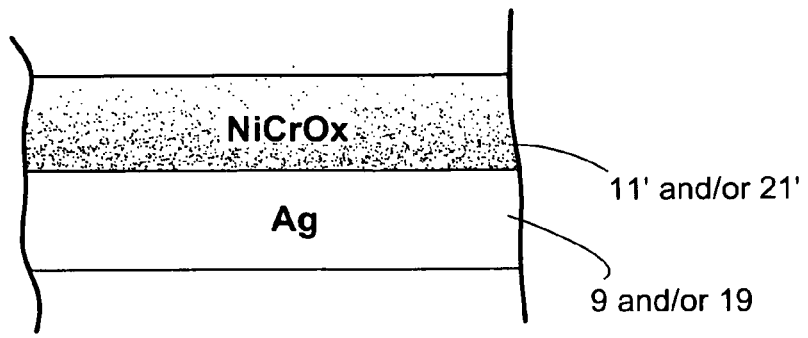
FIG. 4 is a cross sectional view of a portion of a coated article according to an example embodiment of this invention, following ion beam treatment, illustrating an oxidation graded layer formed via at least the ion beam treatment.

Referring to FIGS. 1-4, an example method for making a coated article according to an example embodiment of this invention will now be described. Initially, a glass substrate 1 is provided. Underlying layers 3, 7 and 9 are then sputter deposited on the glass substrate 1. Then, a contact layer 11 of or including NiCr is sputter-deposited on the glass substrate over the underlying layers 3, 7 and 9 so as to contact the upper surface of the IR reflecting layer 9. This contact layer 11, as originally sputter-deposited, may be of NiCr, Ni or $NiCrO_x$ in certain example embodiments of this invention (and may or may not be oxidation graded). After contact layer 11 has originally been sputter deposited, the originally deposited layer 11 is ion treated with an ion beam B as shown in FIG. 3 where the ion beam B includes at least oxygen ions. The ion beam B is generated by ion source 26, and introduces at least oxygen ions into the layer deposited in step S2. An ion energy of the ion source 26 is utilized which will cause the vast majority of oxygen ions to make their way only part-way through the layer 11 originally sputter-deposited in step S2. Since the vast majority of oxygen ions make their way through only part of the layer, the original contact layer 11 becomes oxidation graded since the part of the layer farthest from the ion source 26 (and thus closest to the adjacent IR reflecting layer) is much less oxided (if at all) than those portions closer to the ion source, thereby forming oxidation graded layer 11'. FIG. 4 uses dots to indicate more metallic areas, and thus illustrates that layer 11' is more metallic closer to the adjacent IR reflecting layer 9. Thus, reference numeral 11 refers to the contact layer before ion beam treatment, while reference numeral 11' refers to the oxidation graded layer after ion beam treatment with at least oxygen ions.

After the contact layer has been ion beam treated to form oxidation graded layer 11' (see FIGS. 3-4), additional overlying layers 13, 14, 17, and 19 are then sputter-deposited over the oxidation graded layer 11'. Then, another upper contact layer 21 of or including NiCr is sputter-deposited on the glass substrate so as to contact the upper surface of the IR reflecting layer 19. This contact layer 21, as originally sputter-deposited, may be of NiCr, Ni or $NiCrO_x$ in certain example embodiments of this invention (and may or may not be oxidation graded). After contact layer 21 has originally been sputter deposited, the originally deposited layer 21 is ion treated with an ion beam B as shown in FIG. 3 where the ion beam B includes at least oxygen ions (e.g., a combination of oxygen and argon ions may be used in certain example instances). An ion energy of the ion source 26 is utilized which will cause the vast majority of oxygen ions to make their way only part-way through the layer 21 originally sputter-deposited. Since the vast majority of oxygen ions make their way through only part of the layer, the original contact layer 21 becomes oxidation graded since the part of the layer farthest from the ion source 26 (and thus closest to the adjacent IR reflecting layer 19) is much less oxided (if at all) than those portions closer to the ion source, thereby forming oxidation graded layer 21'. FIG. 4 uses dots to indicate more metallic areas, and thus illustrates that layer 21' when ion beam treated is more metallic closer to the adjacent IR reflecting layer 19. Thus, reference numeral 21 refers to the upper contact layer before ion beam treatment, while reference numeral 21' refers to the oxidation graded layer after ion beam treatment with at least oxygen ions.

In certain example embodiments of this invention, the ion beam treatment of the contact layer is performed in a manner so as to increase the sheet resistance ($R_s$) of the layer by at least about 15%, more preferably at least 20%, and most preferably from about 25 to 50%. For example, ion beam treatment with oxygen ions which increases the sheet resistance of the layer from 80 ohms/square to 115 ohms/square is an increase in sheet resistance of 44%. This is calculated by subtracting 80 from 115 to get 35, and then dividing 35 by 80 to obtain a 44% increase in sheet resistance of the layer due to the ion beam treatment with oxygen ions. In certain example embodiments, the ion beam treatment of the contact layer is performed in a manner so as to increase the sheet resistance ($R_s$) of the layer by at least about 20 ohms/square, more preferably by at least about 25 ohms/square, and most preferably from about 30 to 50 ohms/square. It is noted that the aforesaid increases may vary depending upon the thickness of the layer being ion beam treated and upon the ion energy used by the source. The purposes of this paragraph is to generally illustrate that ion beam treatment of metallic layer(s) with at least oxygen gas increases sheet resistance of the layer(s).

Figure 5A:
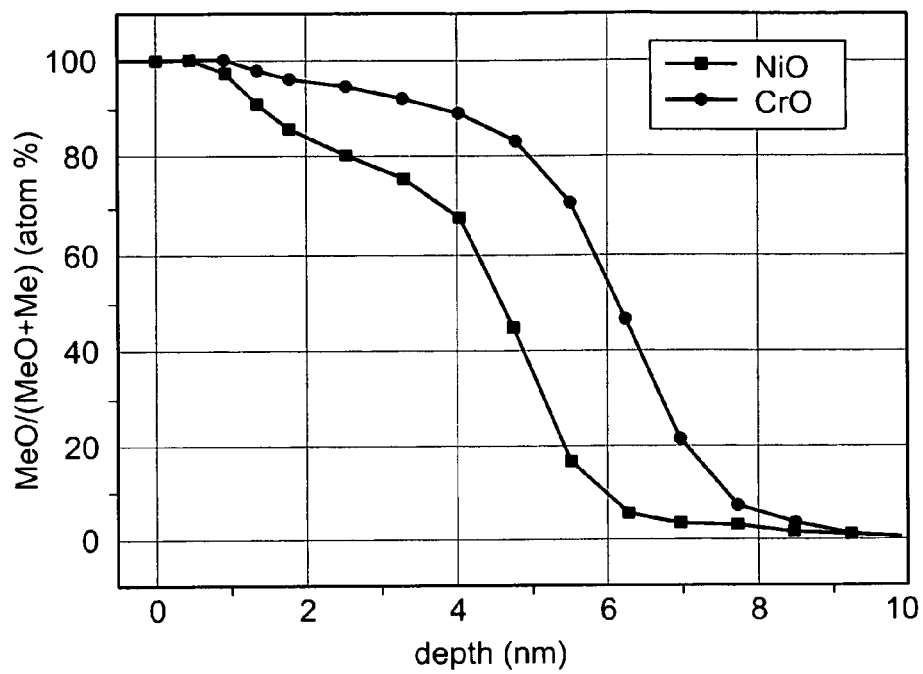
FIG. 5(a) is a graph illustrating the oxidation grading of a $NiCrO_x$ layer according to an example of the instant invention, following ion beam treatment with oxygen ions.
Figure 5B:
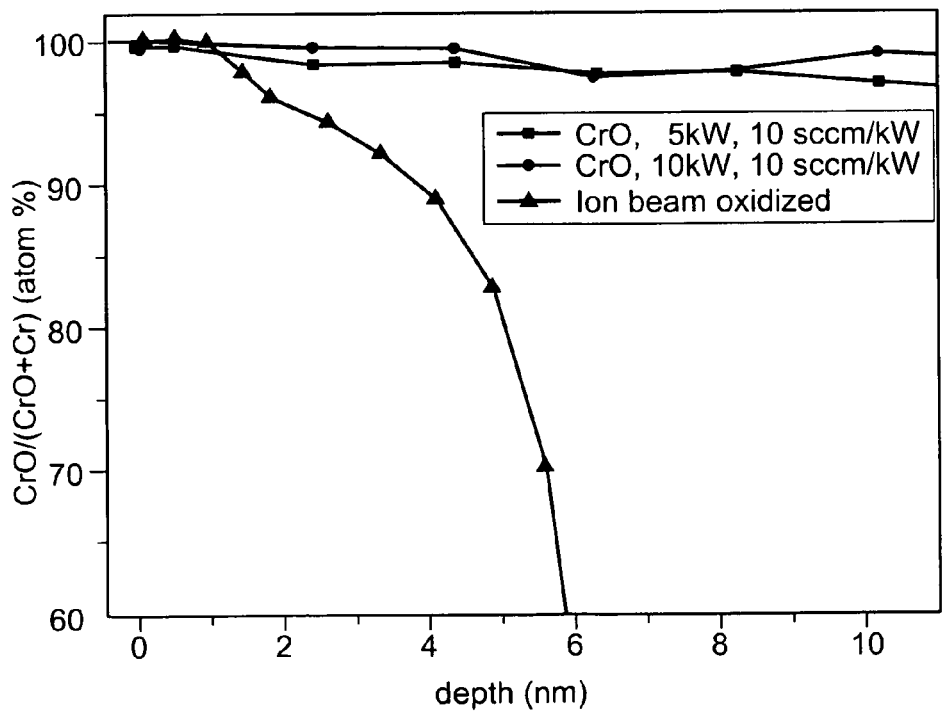
FIG. 5(b) is a graph illustrating the relative amounts of oxided Cr as a function of depth comparing (a) an ion beam treated layer originally sputter-deposited as NiCr and then ion beam treated with oxygen ions, versus (b) a pair of sputter-deposited $NiCrO_x$ layers each sputter deposited in an oxygen inclusive atmosphere without ion beam treatment.

FIG. 5(a) is a graph illustrating the relative oxidation grading of a $NiCrO_x$ layer, in terms of NiO and CrO, according to an example of the instant invention, following ion beam treatment with oxygen ions. In other words, FIG. 5(a) illustrates the relative amount of Ni and Cr atoms over depth for ion beam oxidized $NiCrO_x$. It can be seen that, from the top of the layer downward in FIG. 5(a), the oxidation amount decreases generally for about the first 8 nm (80 Å) of layer thickness, thereby illustrating the oxidation graded nature of the layer.

FIG. (b) is a graph illustrating the relative amounts of oxided Cr as a function of depth comparing (a) an ion beam treated layer originally sputter-deposited as NiCr and then ion beam treated with oxygen ions (triangle line), versus (b) a pair of sputter-deposited $NiCrO_x$ layers each sputter deposited in an oxygen gas inclusive atmosphere without ion beam treatment (square and circle lines, where kW indicates sputtering power and ml/kW is an indication of oxygen gas flow per power unit). It can be seen that the ion beam treated layer realizes significant oxidation grading, in that its oxygen content generally drops over the first 6 nm of the layer from the top of the layer downward. In other words, the ion beam treated layer is much more metallic nearer to the adjacent IR reflecting layer than are the other two layers which were sputtered in a constant oxygen inclusive atmosphere and not ion beam treated.

Figure 8A:
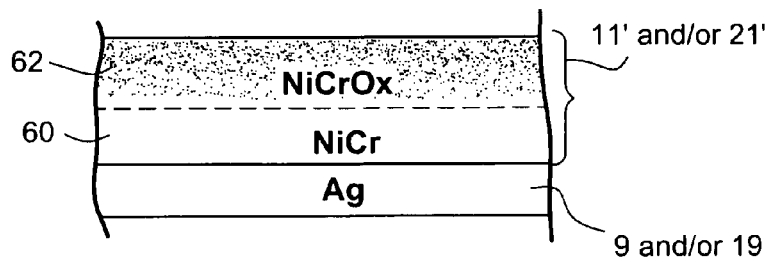
FIGS. 8(a) and 8(b) are cross sectional views of different oxidation graded layers according to different example embodiments of this invention.
Figure 8B:
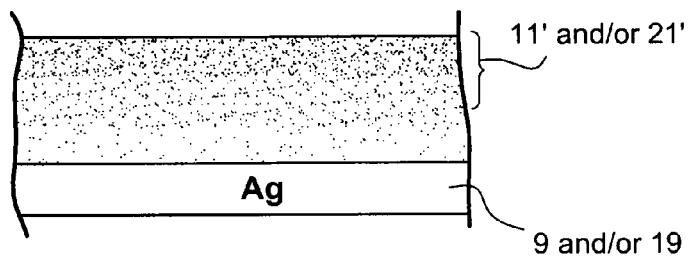

FIGS. 8(a) and 8(b) illustrate two different types of oxidation graded contact layers according to different embodiments of this invention. In FIGS. 8(a)-(b), the "o" elements in the layers represent oxygen content, so that the more dense the "o" elements, the more oxided that portion of the layer. In FIG. 8(a), the oxidation graded layer (11' and/or 21') has a lower portion 60 that is entirely metallic NiCr because the oxygen ions did not penetrate that deeply into the layer, and an upper portion 62 that is partially oxidized. The upper portion 62 of the layer is more oxidized closer to the top surface thereof than at the center thereof, and is more oxidized at the center thereof than at a portion thereof immediately adjacent to the lower portion 60. Again, the lower portion 60 of the oxidation graded layer has little or no oxygen therein. In the FIG. 8(a) embodiment, the imaginary dotted line separating the two portions 60 and 62 of the oxidation graded layer (11' and/or 21') may be located at any suitable location throughout the thickness of the layer.

In contrast with the FIG. 8(a) embodiment, the oxidation graded layer (11' and/or 21') of the FIG. 8(b) embodiment has oxygen present generally throughout the entire thickness of the layer. Thus, it can be seen from the oxygen element symbols "o" in FIG. 8(b) that the oxidation graded layer (11' and/or 21') in FIG. 8(b) is more oxided at a location further from the adjacent IR reflecting layer (9, 19) than at another location closer to the adjacent IR reflecting layer.

It is noted that the oxidation graded nature of layer(s) 11' and/or 21' discussed herein occurs before heat treatment in certain example embodiments of this invention, and optionally also occurs after optional heat treatment such as thermal tempering, heat strengthening, or heat bending.

In each of FIGS. 8(a) and 8(b), the upper surface of layer(s) 11' and/or 21' is at least 50% oxided, more preferably at least 70% oxided, and most preferably at least 80% oxided. In contrast, in the FIG. 8(a) embodiment, the bottom surface of layer 11' and/or 21' is 0% oxided (i.e., it is metallic adjacent the IR reflecting layer 9 and/or 19). Meanwhile, in the FIG. 8(b) embodiment, the bottom surface of layer 11' and/or 21' is from 0-50% oxided, more preferably from 1-40% oxided, and most preferably from 1-20% oxided.

Figure 6:
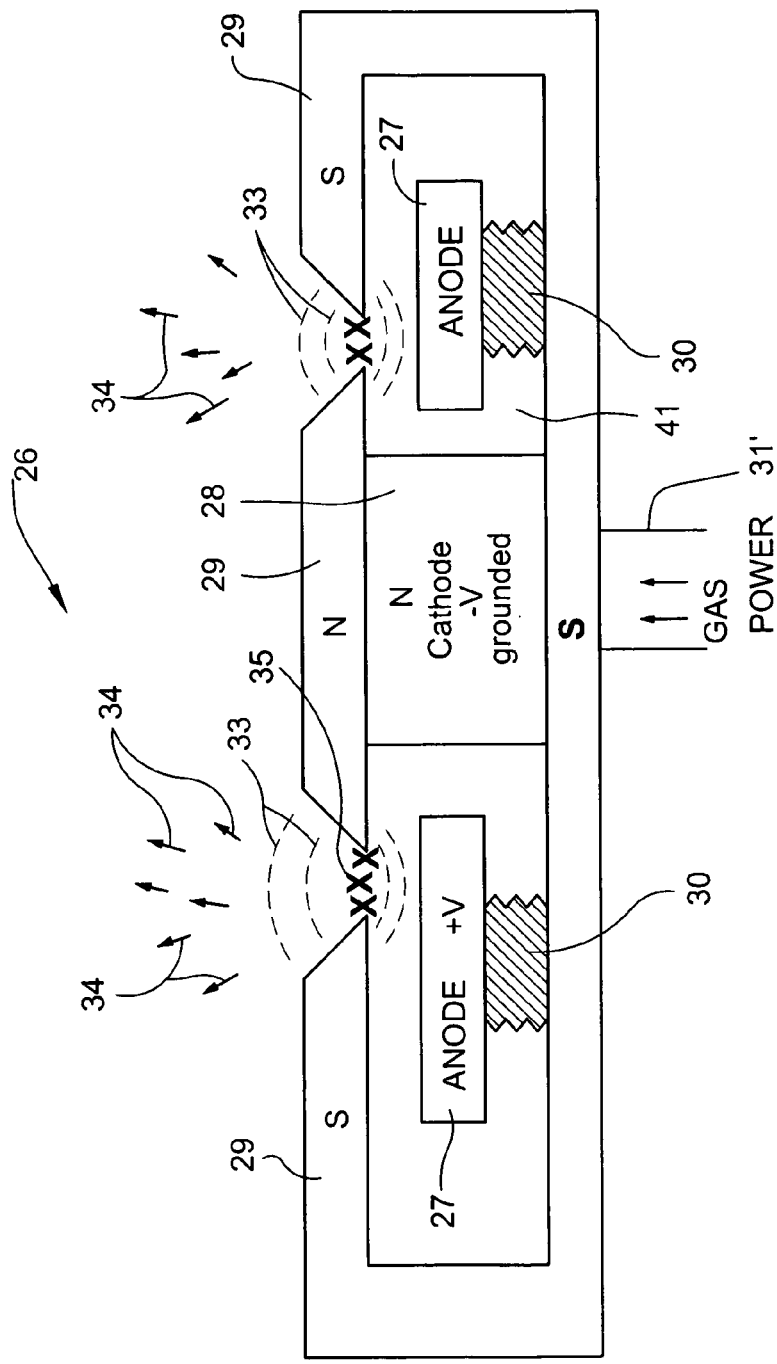
FIG. 6 is a cross sectional view of an example ion source that may be used to ion beam treat layers according to example embodiments of this invention.
Figure 7:
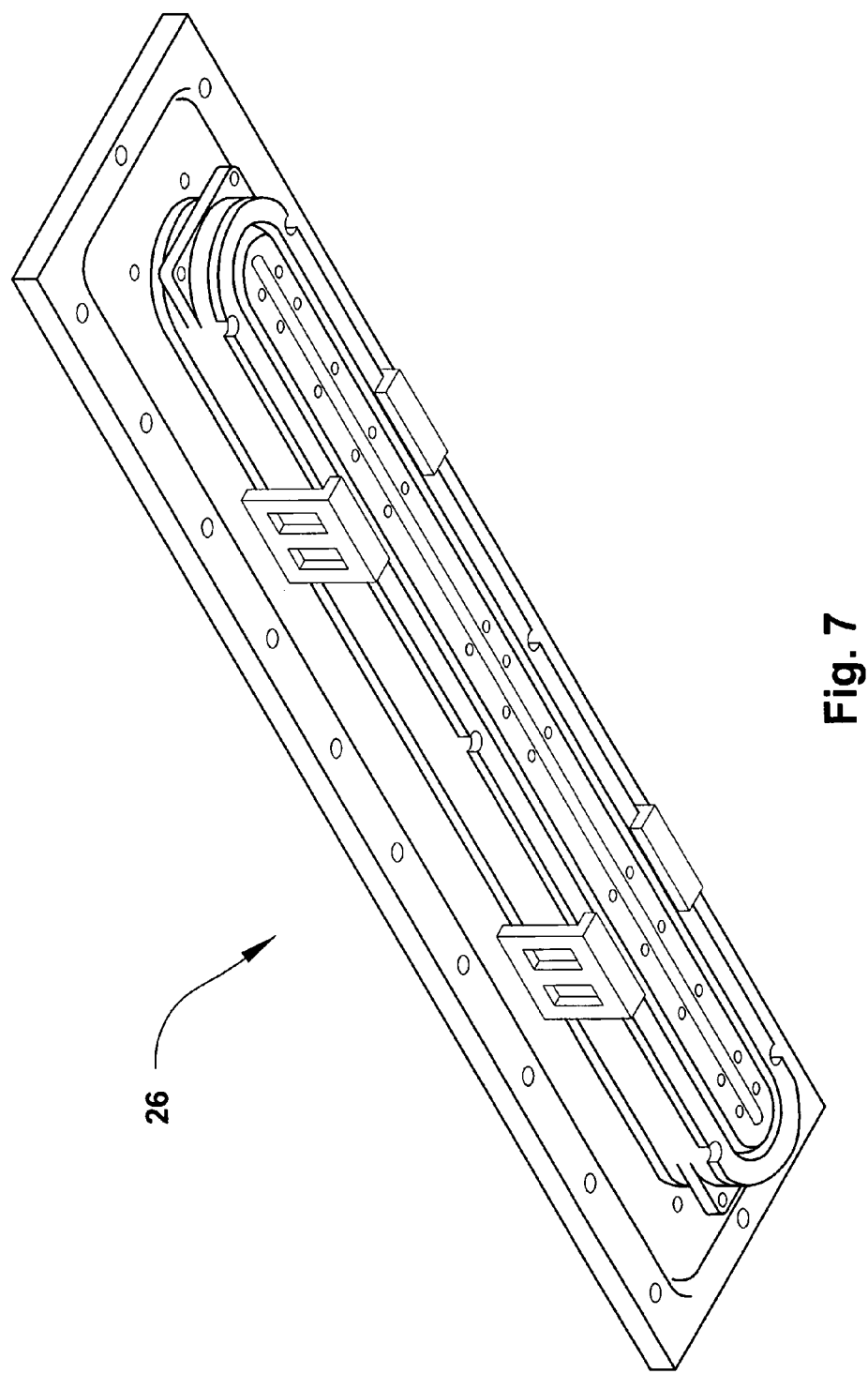
FIG. 7 is a perspective view of the ion source of FIG. 6.

FIGS. 6-7 illustrate an exemplary linear or direct ion beam source 26 which may be used to ion beam treat the surface of sputter deposited layer(s) 11 and/or 21 with at least oxygen ions to create oxidation graded layer(s) 11' and/or 21'. Ion beam source (or ion source) 26 includes gas/power inlet 26, racetrack-shaped anode 27, grounded cathode magnet portion 28, magnet poles 29, and insulators 30. An electric gap is defined between the anode 27 and the cathode 29. A 3 kV or any other suitable DC power supply may be used for source 26 in some embodiments. The oxygen and/or other gas(es) discussed herein for use in the ion source during the ion beam treatment may be introduced into the source via gas inlet 31, or via any other suitable location. Ion beam source 26 is based upon a known gridless ion source design. The linear source may include a linear shell (which is the cathode and grounded) inside of which lies a concentric anode (which is at a positive potential). This geometry of cathode-anode and magnetic field 33 may give rise to a close drift condition. Feedstock gases (e.g., at least oxygen inclusive gas, and optionally a mixture of oxygen and argon gases) may be fed through the cavity 41 between the anode 27 and cathode 29. The voltage used between the anode 27 and cathode 29 during ion beam treatment of the contact layer(s) with at least oxygen ions is preferably at least 800 V, more preferably at least 1,000

V, and most preferably from about 1,000 to 3,500 V (e.g., 3,000 V). Moreover, during such ion beam treatment, the oxygen inclusive gas in the source may be provided in terms of a gas flow of from about 100 to 200 sccm in certain example embodiments of this invention, more preferably from about 135 to 180 sccm. The electrical energy between the anode and cathode then cracks the gas to produce a plasma within the source. The ions 34 are expelled out and directed toward the layer to be ion beam treated in the form of an ion beam. The ion beam may be diffused, collimated, or focused. Example ions 34 are shown in FIG. 6.

A linear source as long as 0.5 to 4 meters may be made and used in certain example instances, although sources of different lengths are anticipated in different embodiments of this invention. Electron layer 35 is shown in FIG. 6 and completes the circuit thereby permitting the ion beam source to function properly. Example but non-limiting ion beam sources that may be used to treat layers herein are disclosed in U.S. Pat. Nos. 6,303,226, 6,359,388, and/or 2004/0067363, all of which are hereby incorporated herein by reference.

In certain example embodiments of this invention, coated articles herein may have the following optical and solar characteristics when measured monolithically (before any optional HT). The sheet resistances ($R_s$) herein take into account all IR reflecting layers (e.g., silver layers 9, 19).

Optical/Solar Characteristics (Monolithic; Pre-HT)

| Characteristic | General | More Preferred | Most Preferred |
| --- | --- | --- | --- |
| $R_s$ (ohms/sq.): | <=6.0 | <=3.0 | <=2.8 |
| $E_n$: | <=0.09 | <=0.04 | <=0.03 |
| $T_{vis}$ (Ill. C 2°): | >=70% | >=75% | >=75.5% |

In certain example embodiments, coated articles herein may have the following characteristics, measured monolithically for example, after heat treatment (HT):

Optical/Solar Characteristics (Monolithic; Post-HT)

| Characteristic | General | More Preferred | Most Preferred |
| --- | --- | --- | --- |
| $R_s$ (ohms/sq.): | <=5.5 | <=2.5 | <=2.1 |
| $E_n$: | <=0.08 | <=0.04 | <=0.03 |
| $T_{vis}$ (Ill. C 2°): | >=70% | >=75% | >=80% |
| Haze: | <=0.40 | <=0.35 | <=0.30 |

Moreover, in certain example laminated embodiments of this invention, coated articles herein which have been heat treated to an extent sufficient for tempering and/or heat bending, and which have been laminated to another glass substrate, may have the following optical/solar characteristics:

Optical/Solar Characteristics (Laminated; Post-HT)

| Characteristic | General | More Preferred | Most Preferred |
| --- | --- | --- | --- |
| $R_s$ (ohms/sq.): | <=5.5 | <=2.5 | <=2.1 |
| $E_n$: | <=0.08 | <=0.04 | <=0.03 |
| $T_{vis}$ (Ill. D65 10°): | >=70% | >=75% | >=77% |
| Haze: | <=0.45 | <=0.40 | <=0.36 |

Moreover, coated articles including coatings according to certain example embodiments of this invention have the following optical characteristics (e.g., when the coating(s) is provided on a clear soda lime silica glass substrate 1 from 1 to 10 mm thick; e.g., 2.1 mm may be used for a glass substrate reference thickness in certain example non-limiting instances) (laminated). While multiple measurements may be taken at different locations across the laminate, this data is based on the average of such points.

Example Optical Characteristics (Laminated: Post-HT)

| Characteristic | General | More Preferred |
| --- | --- | --- |
| $T_{vis}$ (or TY)(Ill. D65 10°): | >=75% | >=77% |
| $a^*_t$ (Ill. D65 10°): | −6 to +1.0 | −4 to 0.0 |
| $b^*_t$ (Ill. D65 10°): | −2.0 to +8.0 | 0.0 to 4.0 |
| $L^*$ (Ill. D65 10°): | 88-95 | 90-95 |
| $R_fY$ (Ill. C, 2 deg.): | 1 to 12% | 1 to 10% |
| $a^*_f$ (Ill. C, 2°): | −5.0 to +2.0 | −3.5 to +0.5 |
| $b^*_f$ (Ill. C, 2°): | −14.0 to +10.0 | −10.0 to 0 |
| $L^*$ (Ill. C 2°): | 30-40 | 33-38 |
| $R_gY$ (Ill. C, 2 deg.): | 1 to 12% | 1 to 10% |
| $a^*_g$ (Ill. C, 2°): | −5.0 to +2.0 | −2 to +2.0 |
| $b^*_g$ (Ill. C, 2°): | −14.0 to +10.0 | −11.0 to 0 |
| $L^*$ (Ill. C 2°): | 30-40 | 33-38 |

The following hypothetical example is provided for purposes of example only, and is not intended to be limiting unless specifically claimed.

Example 1

The following hypothetical Example 1 uses a 2.1 mm thick clear glass substrates so as to have approximately the layer stack set forth below and shown in FIG. 2. The thicknesses are approximations, and are in units of angstroms (Å).

Layer Stack for Example 1

| Layer Glass Substrate | Thickness |
| --- | --- |
| $Si_xN_y$ | 177 |
| $ZnAlO_x$ | 109 |
| Ag | 96 |
| $NiCrO_x$ | 25 |
| $SnO_2$ | 535 |
| $Si_xN_y$ | 126 |
| $ZnAlO_x$ | 115 |
| Ag | 95 |
| $NiCrO_x$ | 25 |
| $SnO_2$ | 127 |
| $Si_3N_4$ | 237 |

Both $NiCrO_x$ layers will be ion beam treated to create respective oxidation graded layers 11' and 21'. The processes used in forming the coated article of the Example are set forth below. The sputtering gas flows (argon (Ar), oxygen (O), and nitrogen (N)) in the below table are in units of sccm (gas correction factor of about 1.39 may be applicable for argon gas flows herein), and include both tuning gas and gas introduced through the main. The line speed was about 5 m/min. The pressures are in units of mbar×$10^{-3}$. The silicon (Si) targets, and thus the silicon nitride layers, were doped with about 10% aluminum (Al). The Zn targets in a similar manner were doped with about 2% Al.

Sputtering Process Used in Example 1

| Cathode | Target | Power(kW) | Ar | O | N | Volts | Pressure |
|---|---|---|---|---|---|---|---|
| C11 | Si | 51.3 | 350 | 0 | 337 | 269 | 2.39 |
| C12 | Si | 51.6 | 350 | 0 | 337 | 271 | 2.36 |
| C14 | Zn | 19.5 | 250 | 350 | 0 | 276 | 2.24 |
| C15 | Zn | 27.8 | 250 | 350 | 0 | 220 | 1.88 |
| C24 | Ag | 9.2 | 250 | 0 | 0 | 541 | 1.69 |
| C25 | NiCr | 16.5 | 350 | 0 | 0 | 510 | 2.33 |
| Perform Ion Beam Treatment to create oxidation grading in NiCr inclusive layer | | | | | | | |
| C28 | Sn | 27.3 | 250 | 454 | 350 | 258 | 2.30 |
| C29 | Sn | 27.3 | 250 | 504 | 350 | 246 | 1.97 |
| C39 | Sn | 30 | 250 | 548 | 350 | 257 | 2.29 |
| C40 | Sn | 28.5 | 250 | 458 | 350 | 245 | 2.20 |
| C41 | Sn | 30.8 | 250 | 518 | 350 | 267 | 2.45 |
| C43 | Si | 59.7 | 350 | 0 | 376 | 285 | 2.47 |
| C45 | Zn | 26.9 | 250 | 345 | 0 | 209 | 3.78 |
| C46 | Zn | 26.8 | 250 | 345 | 0 | 206 | 1.81 |
| C49 | Ag | 9.8 | 150 | 0 | 0 | 465 | 1.81 |
| C50 | NiCr | 16.6 | 250 | 75 | 0 | 575 | 1.81 |
| Perform Ion Beam Treatment to create oxidation grading in NiCr inclusive layer | | | | | | | |
| C54 | Sn | 47.3 | 250 | 673 | 350 | 314 | 1.92 |
| C59 | Si | 65 | 350 | 0 | 463 | 288 | 2.63 |
| C60 | Si | 65 | 350 | 0 | 463 | 330 | 2.56 |

It can be seen that the lower NiCr inclusive contact layer was sputter-deposited as metallic NiCr with no oxygen gas flow during sputtering, whereas the upper NiCr inclusive contact layer was sputter-deposited in an oxygen inclusive atmosphere so as to be slightly oxided upon original deposition.

After being sputter deposited onto the glass substrates, and the NiCr inclusive layers ion beam treated as illustrated above to form oxidation graded layers 11' and 21', the Example coated article was heat treated in a manner sufficient for tempering and heat bending, and following this heat treatment had the following characteristics as measured in monolithic form.

Characteristics of Example 1 (Monolithic; Post-HT)

| Characteristic | Example 1 |
|---|---|
| Visible Trans. ($T_{vis}$ or TY)(Ill. C 2 deg.): | 80.0% |
| a* | −4.8 |
| b* | 10.7 |
| Glass Side Reflectance (RY)(Ill C, 2 deg.): | 8.3% |
| a* | −3.5 |
| b* | 7.8 |
| Film Side Reflective (FY)(Ill. C, 2 deg.): | 7.5% |
| a* | −5.8 |
| b* | 14.2 |
| $R_s$ (ohms/square) (pre-HT): | 2.74 |
| $R_s$ (ohms/square) (post-HT): | 2.07 |
| Haze: | 0.28 |

The coated article of the Example 1 was then laminated to another corresponding heat treated and bent glass substrate to form a laminated vehicle windshield product. Following the lamination, the resulting coated article laminate (or windshield) had the following characteristics.

Characteristics of Example 1 (Laminated; Post-HT)

| Characteristic | Example 1 |
|---|---|
| Visible Trans. ($T_{vis}$ or TY)(Ill. D65 10°): | 77.8% |
| a* | −3.1 |
| b* | 3.5 |
| Glass Side Reflectance (RY)(Ill C, 2 deg.): | 9.0% |
| a* | 1.5 |
| b* | −9.1 |
| Film Side Reflective (FY)(Ill. C, 2 deg.): | 8.9% |
| a* | −1.1 |
| b* | −7.8 |
| $R_s$ (ohms/square): | see above |
| Haze: | 0.32 |

While the aforesaid example ion beam treats layers comprising NiCr, this invention is not so limited. Other layers may be ion beam treated for oxidation grading or otherwise ion beam treated in a similar manner. For examples, layers comprising at least one of Ni, Cr, NiCr, or any other suitable material may be ion beam treated as discussed herein in alternative embodiments of this invention.

Example 2

Figure 9:
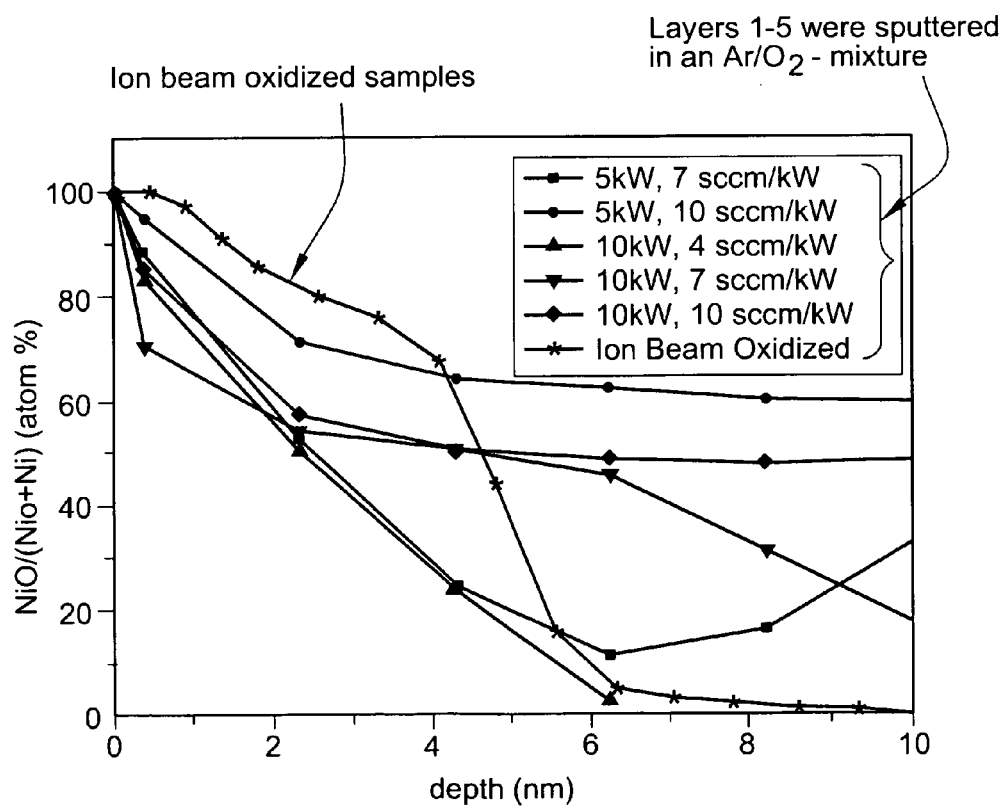
FIG. 9 is a graph illustrating the amount of Ni oxided by ion beam treatment compared to merely sputtering in an oxygen inclusive atmosphere.

In Example 2, six different NiCr inclusive layers were formed and tested as shown in FIG. 9. The first five layers were sputtered directly onto a glass substrate (with no layers therebetween) using a NiCr target in a sputtering atmosphere or argon gas (250 sccm) and oxygen gas in the amounts/power shown in FIG. 9 (oxygen gas flows used during sputtering in FIG. 9 are in units of sccm, and sputter power is in units of kW). Then, a metallic NiCr layer was sputtered directly onto a glass substrate (with no oxygen gas in the sputtering zone), and thereafter ion beam treated with oxygen gas using an ion source anode/cathode voltage of 3,000 V. FIG. 9 illustrates that significantly more Ni was caused to be oxided at a top region of the NiCr inclusive layer using the ion beam treatment compared to merely sputtering in an oxygen inclusive atmosphere. This is highly advantageous as explained above.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

The invention claimed is:
1. A method of making a coated article, the method comprising:
providing a glass substrate;
sputtering a layer comprising silver on the glass substrate;

sputter-depositing a layer comprising NiCr on the substrate over the layer comprising silver, so that the layer comprising NiCr contacts the layer comprising silver;

after the entire layer comprising NiCr has been sputter-deposited on the substrate, ion beam treating at least an upper surface of the layer comprising NiCr with an ion beam comprising at least oxygen ions so that following said ion beam treating the layer comprising NiCr is more oxidized at a location further from the layer comprising silver than at a location closer to the layer comprising silver, wherein the ion beam comprising at least oxygen ions is generated by an ion source, and wherein an ion energy of the ion source is utilized to cause a majority of said oxygen ions to make their way only part-way through the layer comprising NiCr, resulting in an oxygen-graded layer; and following said ion beam treating, sputtering at least a dielectric layer over the layer comprising NiCr.

2. The method of claim 1, wherein the layer comprising NiCr which has been ion beam treated is sandwiched between and in direct contact with both a nitride layer and the layer comprising silver.

3. The method of claim 1, wherein an upper portion of the layer comprising NiCr which has been ion beam treated is at least 50% oxidized.

4. The method of claim 1, wherein an upper portion of the layer comprising NiCr which has been ion beam treated is at least 70% oxidized.

5. The method of claim 1, wherein a bottom portion of the layer comprising NiCr which has been ion beam treated, which is contacting the layer comprising silver, is from 0 to 40% oxidized.

6. The method of claim 1, wherein a bottom portion of the layer comprising NiCr which has been ion beam treated, which is contacting the layer comprising silver, is from 0 to 20% oxidized.

7. The method of claim 1, wherein a bottom portion of the layer comprising NiCr which has been ion beam treated, which is contacting the layer comprising silver, is metallic.

8. The method of claim 1, further comprising heat treating the coated article in a manner sufficient for at least one of tempering and heat bending, so that following said heat treating the coated article has a visible transmission of at least 70% and a sheet resistance ($R_s$) of no greater than 5.5 ohms/square.

9. The method of claim 1, further comprising heat treating the coated article in a manner sufficient for at least one of tempering and heat bending, so that following said heat treating the coated article has a visible transmission of at least 75% and a sheet resistance ($R_s$) of no greater than 2.5 ohms/square.

10. The method of claim 1, wherein prior to any optional heat treating, the coated article in monolithic form has a visible transmission of at least 70% and a sheet resistance ($R_s$) of no greater than 6.0 ohms/square.

11. The method of claim 1, further comprising sputtering a layer comprising silicon nitride on the glass substrate so that the layer comprising silicon nitride directly contacts the glass substrate and is located between the glass substrate and the layer comprising silver.

12. The method of claim 1, further comprising sputtering a layer comprising zinc oxide on the glass substrate, so that the layer comprising silver is located over and directly contacting the layer comprising zinc oxide.

13. The method of claim 1, wherein said ion beam treating comprises flowing a combination of at least oxygen and argon gases through an ion source, and causing the ion source to generate an ion beam including both oxygen and argon ions that are directed toward the layer comprising NiCr.

14. The method of claim 1, further comprising:
sputtering another layer comprising silver on the glass substrate so as to be located over the dielectric layer;
sputtering another layer comprising NiCr on the substrate over the another layer comprising silver, so that the another layer comprising NiCr contacts the another layer comprising silver;
ion beam treating at least an upper surface of the another layer comprising NiCr with at least oxygen ions so that following said ion beam treating the another layer comprising NiCr is more oxidized at a location further from the another layer comprising silver than at a location closer to the another layer comprising silver; and
following said ion beam treating, sputtering at least another dielectric layer over the another layer comprising NiCr.

15. A method of making a coated article, the method comprising:
providing a glass substrate;
sputtering an IR reflecting layer on the glass substrate;
sputter-depositing a layer comprising Ni and/or Cr on the glass substrate over the IR reflecting layer; and
after sputter-depositing the entire layer comprising Ni and/or Cr on the glass substrate, ion beam treating at least an upper surface of the layer comprising Ni and/or Cr with an ion beam comprising at least oxygen so that following said ion beam treating the layer comprising Ni and/or Cr is more oxidized at a location further from the IR reflecting layer than at a location closer to the IR reflecting layer, wherein the ion beam comprising at least oxygen ions is generated by an ion source, and wherein an ion energy of the ion source is utilized to cause a majority of said oxygen ions to make their way only part-way through the layer comprising Ni and/or Cr, resulting in an oxygen-graded layer.

16. The method of claim 15, wherein the layer comprising Ni and/or Cr contacts an upper surface of the IR reflecting layer.

17. The method of claim 15, wherein the IR reflecting layer comprises silver.

18. The method of claim 15, wherein an upper portion of the layer comprising Ni and/or Cr which has been ion beam treated is at least 50% oxidized.

19. The method of claim 15, wherein a bottom portion of the layer comprising Ni and/or Cr which has been ion beam treated, and which is contacting the IR reflecting layer, is from 0 to 40% oxidized.

20. The method of claim 19, wherein a bottom portion of the layer comprising Ni and/or Cr which has been ion beam treated is metallic.

21. The method of claim 15, further comprising heat treating the coated article so that following said heat treating the coated article has a visible transmission of at least 70% and a sheet resistance ($R_s$) of no greater than 5.5 ohms/square.

22. The method of claim 15, wherein prior to any optional heat treating, the coated article in monolithic form has a visible transmission of at least 70% and a sheet resistance ($R_s$) of no greater than 6.0 ohms/square.

23. The method of claim 15, further comprising sputtering a layer comprising silicon nitride on the glass substrate so that the layer comprising silicon nitride is located between the glass substrate and the IR reflecting layer.

24. The method of claim 15, further comprising sputtering a layer comprising zinc oxide on the glass substrate, so that the IR reflecting layer is located over and directly contacting the layer comprising zinc oxide.

25. The method of claim 15, wherein said ion beam treating comprises flowing a combination of at least oxygen gas and at least one inert gas through an ion source, and causing the ion source to generate an ion beam including at least oxygen ions that are directed toward the layer comprising Ni and/or Cr.

26. The method of claim 15, further comprising, following said ion beam treating, sputtering at least a dielectric layer over the layer comprising Ni and/or Cr.

27. The method of claim 15, further comprising using the coated article in at least one of an insulating glass (IG) window unit and a vehicle window.

28. A vehicle window made using the method of claim 15.

29. An insulating glass (IG) window unit made using the method of claim 15.

30. The method of claim 15, wherein the layer comprising Ni and/or Cr is metallic prior to said ion beam treating.

31. A method of making a coated article, the method comprising:
providing a substrate;
forming a layer comprising at least one metal on the substrate;
after the entire layer comprising the at least one metal has been deposited, ion beam treating at least an upper surface of the layer comprising the at least one metal so that following said ion beam treating the layer is more oxidized at a location further from the substrate than at a location closer to the substrate, wherein the ion beam is generated by an ion source, and wherein an ion energy of the ion source is utilized to cause a majority of said ions to make their way only part-way through the layer comprising at least one metal.

32. The method of claim 31, wherein the layer that is ion beam treated is located over and contacting a layer comprising silver, so that following said ion beam treating the layer is more oxidized at a location further from the layer comprising silver than at a location closer to the layer comprising silver.

33. The method of claim 31, wherein the layer comprises Ni and/or Cr, and contacts an upper surface of an IR reflecting layer.

34. The method of claim 31, wherein a bottom portion of the layer which has been ion beam treated is metallic.

35. The method of claim 31, wherein the coated article has a visible transmission of at least 70%.

36. The method of claim 31, further comprising, following said ion beam treating, sputtering at least a dielectric layer over the layer which has been ion beam treated.

37. The method of claim 31, further comprising using the coated article in at least one of an insulating glass (IG) window unit and a vehicle window.

38. The method of claim 31, wherein the layer comprising at least one metal comprises at least one of Ni, Cr, NiCr and $NiCrO_x$.

39. The method of claim 1, wherein following said ion beam treating at least a portion of the layer comprising NiCr is oxidation graded so that oxygen content of said at least a portion of the layer continuously decreases moving through said portion of the layer toward the layer comprising silver.

40. The method of claim 15, wherein following said ion beam treating at least a portion of the layer comprising Ni and/or Cr is oxidation graded so that oxygen content of said at least a portion of the layer continuously decreases moving through said portion of the layer toward the layer comprising silver.

41. The method of claim 31, wherein following said ion beam treating at least a portion of the layer is oxidation graded so that oxygen content of said at least a portion of the layer continuously decreases moving through said portion of the layer toward the substrate.

42. A method of making a coated article, the method comprising:
providing a glass substrate;
sputtering a layer on the glass substrate;
after the entire layer has been sputter-deposited on the glass substrate, ion beam treating at least an upper surface of the layer on the glass substrate with at least one reactive gas so as to modify a stoichiometry thereof using an ion beam comprising at least oxygen ions, wherein the ion beam is generated by an ion source, and wherein an ion energy of the ion source is utilized to cause a majority of said oxygen ions to make their way only part-way through the layer that has been ion beam treated, resulting in an oxygen-graded layer; and
following said ion beam treating, sputtering at least another layer over the layer that has been ion beam treated.

43. The method of claim 42, wherein the reactive gas comprises oxygen.

44. The method of claim 42, wherein other layer(s) are provided between the substrate and the layer that is ion beam treated.

45. The method of claim 42, wherein the layer that is ion beam treated comprises Ni and/or Cr.

* * * * *